(12) United States Patent
Roizin et al.

(10) Patent No.: US 7,482,233 B2
(45) Date of Patent: Jan. 27, 2009

(54) EMBEDDED NON-VOLATILE MEMORY CELL WITH CHARGE-TRAPPING SIDEWALL SPACERS

(75) Inventors: Yakov Roizin, Afula (IL); Amos Fenigstein, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 11/753,493

(22) Filed: May 24, 2007

(65) Prior Publication Data

US 2007/0224751 A1    Sep. 27, 2007

Related U.S. Application Data

(62) Division of application No. 11/104,210, filed on Apr. 11, 2005, now Pat. No. 7,227,234.

(60) Provisional application No. 60/636,021, filed on Dec. 14, 2004.

(51) Int. Cl.
*H01L 21/8234* (2006.01)

(52) U.S. Cl. ............... 438/276; 438/275; 257/E21.625; 257/E21.639; 257/408

(58) Field of Classification Search ........... 438/275, 438/276
See application file for complete search history.

(56) References Cited

U.S. PATENT DOCUMENTS

| | | |
|---|---|---|
| 4,818,714 A | 4/1989 | Haskell |
| 4,855,247 A | 8/1989 | Ma et al. |
| 5,267,194 A | 11/1993 | Jang |
| 5,347,161 A | 9/1994 | Wu et al. |
| 5,602,788 A | 2/1997 | Barry et al. |
| 5,760,435 A | 6/1998 | Pan |
| 5,768,192 A | 6/1998 | Eitan |
| 6,008,077 A | 12/1999 | Maeda |
| 6,025,267 A | 2/2000 | Pey et al. |
| 6,180,472 B1 | 1/2001 | Akamatsu et al. |
| 6,249,015 B1 | 6/2001 | Matsuo et al. |
| 6,277,683 B1 | 8/2001 | Pradeep et al. |

(Continued)

OTHER PUBLICATIONS

Fukuda, Masatoshi et al., New Nonvolatile Memory With Charge-Trapping Sidewall, IEEE Electron Device Letters, vol. 24, No. 8, Jul. 2003, pp. 490-492.

*Primary Examiner*—David Vu
*Assistant Examiner*—Earl N Taylor
(74) *Attorney, Agent, or Firm*—Bever, Hoffman & Harms, LLP; Patrick Y. Bever

(57) ABSTRACT

An IC includes both "volatile" CMOS transistors (FETs) and embedded non-volatile memory (NVM) cells, both including polysilicon gate structures, sidewall oxide layers, sidewall spacer structures, and source/drain regions. The sidewall spacers of both the NVM cells and the FETs are made up of a spacer material with local charge storage nodes that is capable of storing electrical charge (e.g., silicon-nitride with traps or oxide with silicon nanocrystals). The source/drain regions of the NVM cells omit lightly-doped drains (which are used in the CMOS FETs), and the NVM cells are formed with thinner sidewall oxide layers than the CMOS FETs to facilitate programming/erasing operations. A production method includes a modified CMOS process flow where the CMOS FET gate structures receive different source/drain diffusions and oxides than the NVM gate structures, but both receive substantially identical sidewall spacers, which are used as charge storage structures in the NVM cells.

6 Claims, 7 Drawing Sheets

U.S. PATENT DOCUMENTS

| | | |
|---|---|---|
| 6,348,387 B1 | 2/2002 | Yu |
| 6,469,341 B1 * | 10/2002 | Sung et al. ............... 257/316 |
| 6,762,085 B2 | 7/2004 | Zheng et al. |
| 6,765,259 B2 | 7/2004 | Kim |
| 6,803,620 B2 | 10/2004 | Moriya et al. |
| 6,825,073 B1 | 11/2004 | Wu |
| 6,885,072 B1 | 4/2005 | Jeng |
| 2002/0142523 A1 | 10/2002 | Ryu et al. |
| 2003/0222303 A1 | 12/2003 | Fukuda et al. |
| 2004/0041199 A1 | 3/2004 | Kim |
| 2004/0157397 A1 * | 8/2004 | Quek ..................... 438/305 |
| 2004/0232477 A1 * | 11/2004 | Iwata et al. ............. 257/315 |
| 2005/0037577 A1 | 2/2005 | Kim et al. |

* cited by examiner

EMBEDDED NON-VOLATILE MEMORY CELL WITH CHARGE-TRAPPING SIDEWALL SPACERS

RELATED APPLICATION

This application is a divisional of U.S. patent application Ser. No. 11/104,210, entitled "Embedded Non-Volatile Memory Cell With Charge-Trapping Sidewall Spacers" filed Apr. 11, 2005, now U.S. Pat. No. 7,227,234, which claims priority of U.S. patent U.S. Provisional Application Ser. No. 60/636,021 filed by Yakov Roizin and Amos Fenigstein on Dec. 14, 2004.

FIELD OF THE INVENTION

The present invention relates to non-volatile memory (NVM) cells. More specifically, the present invention relates to NVM cell arrays that are "embedded" in (i.e., integrally formed with) otherwise non-volatile integrated circuits (ICs), to methods for fabricating the NVM cells in an inexpensive manner.

BACKGROUND OF THE INVENTION

Several non-volatile memory (NVM) devices have been introduced that reduce memory size by facilitating the storage of multiple bits per NVM cell. For example, a 2-bit non-volatile semiconductor memory transistor including oxide-nitride-oxide storage structure has been described in U.S. Pat. No. 5,768,192, to Eitan. A problem with these types of 2-bit NVM devices is that they require a special photolithographic fabrication procedure (process flow), and therefore are not conducive to use as embedded NVM memory in larger circuits (e.g., system-on-a-chip devices). Further, the operating voltages (i.e., to perform program/erase operations) is typically much higher than the operating voltage of a modern CMOS integrated circuit (IC).

Another type of 2-bit NVM device disclosed, for example, in U.S. Pat. Application No. 2003/222,303, to Fukuda et al. utilizes special (e.g., silicon nitride) storage structures formed inside silicon-oxide sidewall spacers to store data. This type of 2-bit NVM may be utilized to provide an embedded NVM array in a larger integrated circuit (IC), but requires substantial modification to an existing (e.g., CMOS) process flow in order to form both the storage structures and the sidewall spacers. Further, such NVM cells can be relatively unreliable due to misalignment between the relatively small storage structures and associated source/drain regions, which can lead to process related variations that inevitably lead to strong Vt (threshold voltage) and programmability spread.

What is needed is a low-cost embedded NVM cell array that can be implemented using a minimum of additional masks to an existing CMOS process flow, that would not require high operating voltages (i.e., less than 6V), and that would exhibit a reliability that is equal to or greater than existing embedded NVM solutions.

SUMMARY OF THE INVENTION

The present invention is directed to a low-cost embedded non-volatile memory (NVM) cell array that can be implemented to an existing CMOS process flow using a minimum number of additional masks and processing steps, where the NVM cells require relatively low operating voltages (i.e., less than 6V) and exhibit a reliability that is equal to or greater than existing embedded NVM solutions. The present invention is also directed to a method for fabricating CMOS ICs including this improved NVM cell that is largely compatible with conventional CMOS process flows, thus providing a highly efficient and economical method for producing ICs having embedded flash (or other NVM) memory.

In accordance with an embodiment of the present invention, an integrated circuit (IC) is fabricated using CMOS fabrication technology and includes both "volatile" CMOS field-effect transistors (FETs) and an embedded NVM cell array including NVM cells, where both the CMOS FETs and NVM cells include polycrystalline silicon ("polysilicon") gate structures formed on associated gate oxide layers, sidewall oxide layers respectively formed on sidewalls of the gate structures, sidewall spacer structures respectively formed on the sidewall oxide layers, and source/drain regions formed under the sidewall spacer structures.

In accordance with an aspect of the present invention, the sidewall spacers of both the NVM cells and the FETs are made up of a spacer material that is capable of storing electrical charge (e.g., silicon-nitride or silicon nanocrystals containing oxide or any other dielectric materials and/or their combinations that allow charge trapping, e.g. high-k dielectrics; in this case less voltage drop on the trapping layer, and thus lower voltages in programming/erase). Because the same sidewall spacer material is used in the fabrication of both the FETs and NVM cells, overall fabrication costs are reduced by avoiding multiple spacer etch-back operations, which are required when the FET sidewall spacers differ from the charge storage structures of embedded NVM cells. Note that, because both the sidewall spacers of the FETs and the charge storage structures of embedded NVM cells are deposited and processed simultaneously, these sidewall spacers and charge storage structures have substantially the same size and cross-sectional shape. In one disclosed embodiment, the NVM gate structures define an undercut region, and the charge storage structures include protrusions that extend into the undercut regions.

In accordance with another aspect of the present invention, in order to utilize the sidewall spacers of the NVM cells as charge storing structures, the source/drain regions of the NVM cells differ from the source/drain regions of the FETs in that the NVM source/drain regions do not extend under the NVM gate structure (i.e., the NVM source/drain regions omit the lightly-doped drain (LDD) region used in the FET source/drain regions, and/or the NVM cells include pocket implants that extend from the source/drain regions under the gate structure). This arrangement enhances the drain field of the NVM cells, thereby facilitating programming/erasing of the charge storing structures (i.e., increasing/decreasing the electrons stored in the sidewall spacer material for a fixed program/erase time), thus affecting the threshold voltage of the NVM cell. In one embodiment SiN sidewall spacer material is used, and programming of a selected charge storage structure is achieved by applying suitable (e.g., positive) voltage to the gate structure and an adjacent source/drain region, thereby generating channel hot electrons (CHEs) that become trapped in the charge storage structure. Conversely, erasing is performed by applying suitable (negative) voltage to the gate structure and a suitable (e.g., positive) voltage an adjacent source/drain region, thereby generating band-to-band tunneling (BBT) of holes from the charge storage structure. Alternatively, when the sidewall spacers are formed using Si nanodots, programming is achieved by CHE, and erasing is performed using Fowler-Nordheim (FN) tunneling. Note that this programming/erasing process facilitates two-bit operation of the NVM cell (i.e., each of the sidewall spacers can be programmed and read separately by reversing the direction of the applied program/read currents).

In accordance with another aspect of the present invention, the thicknesses of the oxide layers separating charge storage structures and gate structures of the NVM cells from the underlying substrate are equal to or less than thicknesses of the corresponding oxide layers utilized in the CMOS FETs. A benefit of using the same oxide layer thicknesses in both the NVM cells and the FETs is that the fabrication process is greatly simplified, thus reducing overall manufacturing costs. However, these relatively thick oxide layers require relatively high program/erase voltages. In contrast, the present inventors have found that the NVM cells exhibit superior operating characteristics when the oxide layers separating the charge storing sidewall spacer structures from the gate structure and the underlying substrate are thinner than those used in the FETs. In one example involving a 0.18 micron CMOS process flow, the FETs are formed using TEOS oxide having a thickness of approximately 200 A, whereas the NVM cells are formed using a sidewall oxide having a thickness of 80 A and a bottom oxide thickness of 60 A. These oxide thicknesses, combined with the source/drain configuration described above, facilitating program/erase operations using relatively low voltages (e.g., 5 Volts).

In accordance with another embodiment of the present invention, a method for producing ICs is incorporated into a CMOS process flow, and begins by forming gate structures for both the NVM and CMOS FET transistors. The present invention then deviates from a convention CMOS process flow in that lightly-doped drain (LDD) implants are only formed in the CMOS FETs (i.e., omitted in the formation of NVM cells). Subsequent to forming the gate structures and LDD implants, substantially identical sidewall spacer structures are formed on both the NVM and FET gate structures using a spacer material that is capable of storing static electric charge (e.g., SiN or Si nanodots). After spacer formation, heavily-doped drain (HDD) implants are formed in both the NVM and FET structures according to well known practices, and subsequent layers are formed according to known CMOS techniques. Thus, the present method produces two types of transistors that include substantially identical sidewall spacer structures: those without LDD implants that are optimized for NVM cells, and those with LDD implants that are optimized for normal FET operations. By forming both the volatile FETs and embedded NVM array using substantially identical sidewall spacer structures (e.g., SiN), the present method avoids the need for performing a difficult double spacer etch procedure, which is required when two sidewall spacer materials are utilized. Further, by forming the entire spacer structure using a charge storing material (e.g., SiN), the resulting NVM cell is substantially more reliable than conventional cells in which the charge storing material makes up only a portion of the spacer structure. That is, when the charge storing material makes up only a portion of the spacer structure, the junction edge must be very precisely aligned under the charge storing material to prevent process related variations that inevitably lead to strong Vt (threshold voltage) and programmability spread.

In accordance with alternative embodiments, the gate structures associated with the NVM cells and the FETs may be formed (etched) from a polysilicon layer at the same time, or may be formed at different times.

In a first specific embodiment, after forming the polysilicon layer, a mask is used to pattern only the FET gate structure (the polysilicon layer region associated with the NVM cells remains intact). LLD regions are formed in the FETs, and then the etch mask is removed, and a Tetraethyl Orthosilicate (TEOS) oxide layer is deposited over the FET gate structures and over the remaining polysilicon layer portion. A second etch mask is then formed that protects the existing NVM gate structures and TEOS oxide, and facilitates etching of the remaining polysilicon layer portion to form the NVM gate structures. The second etch mask is then removed, and then a high quality oxide layer is grown on the NVM gate structures and adjacent substrate. The process flow then continues with sidewall spacer formation.

In a second specific embodiment, both the FET gate structures and the NVM gate structure are simultaneously patterned, but then LLD regions are formed only in the FETs. Next, a TEOS oxide layer is deposited over both the FET gate structures and the NVM gate structures, and a mask is then formed that protects the existing FET gate structures, and facilitates etching (removing) the TEOS oxide from the NVM gate structures. A high quality oxide layer is grown on the NVM gate structures and adjacent substrate. The process flow then continues with sidewall spacer formation.

In accordance with another alternative embodiment, the NVM gate structures are subjected to a wet overetch to define undercut regions, and charge storage structures are formed to include protrusions that extend into the defined undercut regions (with sidewall oxide layers 153A formed therebetween).

In accordance with yet another alternative embodiment, the NVM cells are processed such that P-type pocket implants are formed under the gate structure prior to forming N+ source/drain regions.

In accordance with another embodiment of the present invention, the source/drain regions of four adjacent NVM cells are formed as H-shaped diffusions, with two adjacent NVM cells sharing each leg of the H-shaped diffusion. Because each source/drain region only serves as a source/drain region for four different NVM cells (and not an entire diffusion bit line of the embedded NVM cell array), the array structure of the present invention advantageously provides a low source/drain series resistance and relatively low bit line resistances.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
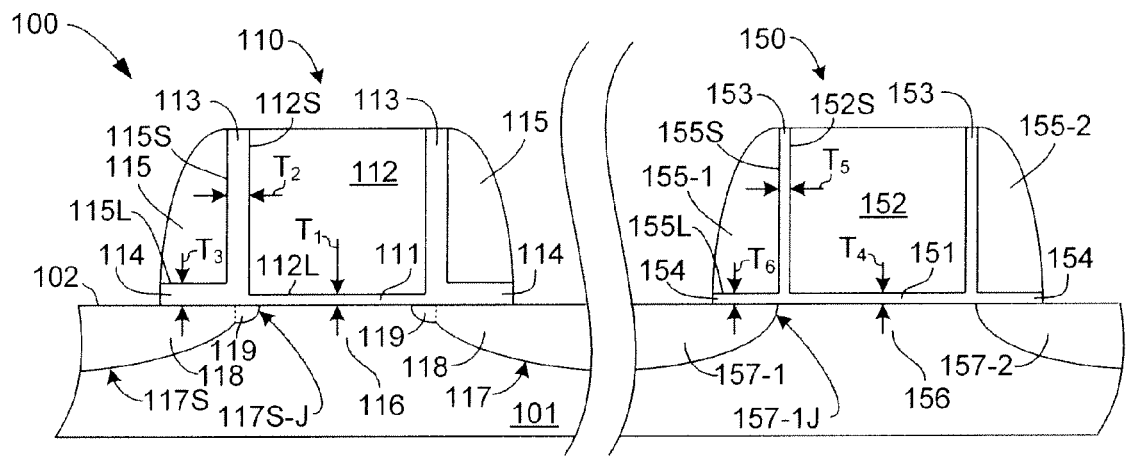
FIG. 1 is a simplified cross-sectional side view showing a portion of an integrated circuit formed in accordance with an embodiment of the present invention.

FIG. 1 is a simplified cross-sectional side view showing a portion of an integrated circuit (IC) 100 that includes both a volatile field-effect transistor (FET) 110 and a non-volatile memory (NVM) cell 150, which are formed on an upper surface 102 of a semiconductor (e.g., monocrystalline silicon) substrate 101 in accordance with an exemplary embodiment of the present invention. FET 110 and NVM cell 150 respectively represent and are substantially identical to a multiplicity of other FETs and NVM cells (not shown) that make up IC 100.

According to an aspect of the present invention, NVM cell 150 includes structures that are similar to those of CMOS FET 110, thus facilitating the fabrication of both NVM cell 150 and FET 100 using substantially the same photolithographic (e.g., CMOS) process flow steps (i.e., using the same deposited materials and minimizing the number of additional masks). Similar to conventional CMOS transistors, FET 110 includes a polycrystalline silicon ("polysilicon") gate structure 112 formed on a gate oxide layer 111, side oxide layers 114 respectively formed on sidewalls 112S of gate structure 112, sidewall spacers 115 respectively formed on lower oxide layers 113 and having inside walls 115S abutting side oxide layers 114, and a channel region 116, an implanted source/drain regions 117-1 and 117-2 (collectively "source/drain regions 117") defined in substrate 101 under gate structure 112 and sidewall spacers 115. Similarly, NVM cell 150 includes a gate structure 152 formed on a gate oxide layer 151, side oxide layers 154 respectively formed on sidewalls 152S of gate structure 152, charge storage structures 155-1 and 155-2 (collectively "charge storage structures 155"), which are respectively formed on lower oxide layers 153 and abutting side oxide layers 154, and a channel region 156, an implanted source/drain regions 157-1 and 157-2 (collectively "source/drain regions 157") formed in substrate 101 under gate region 152 and charge storage structures 155 in the manner shown in FIG. 1.

According to another aspect of the present invention, sidewall spacers 115 of FET 110 and charge storage structures 155 of NVM cell 150 comprise a spacer material that is capable of storing electrical charge (e.g., silicon-nitride or nanocrystal containing oxide or any other dielectric materials with local storage nodes and/or their combinations that allow charge trapping, e.g., high-k dielectrics). In addition, sidewall spacers 115 and charge storage structures 155 are fabricated during the same CMOS process flow steps, and thus comprise substantially identical structures. The term "substantially identical structures" is defined herein to mean that the spacer material(s) used to form sidewall spacers 115 and charge storage structures 155 are substantially identical (i.e., both are formed from the same deposited spacer material), the same processing operation(s) (e.g., sidewall etch) are used to define sidewall spacers 115 and charge storage structures 155 from the deposited spacer materials, and the resulting sidewall spacers 115 and charge storage structures 155 are subjected to the same processing (e.g., sidewall etchback) such that they are substantially identical in size and shape (with slight variations possibly due to differences in associated oxide thickness and/or localized processing variations). In effect, by forming both sidewall spacers 115 of FET 110 and charge storage structures 155 of NVM cell 150 from identical charge storage materials (e.g., silicon-nitride (SiN) or Si nanodots containing oxide), the present invention provides for the fabrication of ICs including embedded NVM arrays that require only a minimum alteration from existing CMOS fabrication process flows, thus providing the embedded NVM arrays with minimal additional cost over the same IC that does not include the embedded NVM array.

According to another aspect of the present invention, in order to facilitate non-volatile operation, source/drain regions 157 of NVM cell 150 differ from source/drain regions 117 of FET 110 in that, whereas source/drain regions 117 include both a heavy-doped drain (HDD) region 118 and a lightly-doped drain (LDD) region 119, source/drain regions 157 include only a HDD region (i.e., LDD regions are omitted and/or replaced with pocket implants in source/drain regions 157). The present inventors determined that, if the distances between the source/drain junctions and the associated gate side edges are small enough, MOS-type FETs can operate even when the source/drain regions are not overlapped by the gate structure (i.e., the source/drain diffusion does not extend under the gate structure). This arrangement enhances the drain field of NVM cell 150 compared with the electric field in a standard CMOS transistor where LDD implants serve to decrease the lateral electrical fields, thereby this arrangement facilitates programming/erasing of charge storing structures 155, which in turn affects its threshold voltage. Further, the present inventors found that, when the LDD implant was omitted from a CMOS process flow during an experiment, the threshold voltage Vt of the CMOS medium voltage (70 A GOX) transistor practically does not change from a similar transistor that includes the LDD implant (assuming no charge is stored in the sidewall spacer structure). The present inventors determined from simulations and decorated cross-sections that acceptable operating characteristics were produced when the metallurgical source/drain junctions were located 100 A outside of the polysilicon gate side edge. Simulated saturated drain current (Idsat), maximum substrate current (Isub max), and threshold voltage (Vt) data for both standard transistors ("Std TS18SL") and transistors that omit LDD (and pocket) implants ("Skipped LDD and PI implants") are shown in Table 1:

TABLE 1

|  | Std TS18SL | Skipped LDD and PI implants |
| --- | --- | --- |
| Vt | 0.74 V | 0.71 V |
| Idsat | 632 uA/um | 502 uA/um |
| Isub max | 96 uA/um | 47 uA/um |

The present inventors also found that, if the $SiO_2$ layer under the sidewall spacer is made thinner in the manner described below, the inner edge of the charge storing (sidewall spacer) structure (e.g., edge 155S of charge storage region 155-1) will be situated at the associated junction 157-1J of source/drain region 157-1, as depicted in FIG. 1. Thus, as described in additional detail below, programming and erase of NVM cell 150 can be done as in a standard NROM transistor.

According to another aspect of the present invention, thickness of the oxide layers separating charge storage structures 155 and gate structure 152 from substrate 101 and are equal to or less than corresponding thicknesses of the oxide layers separating sidewall spacers 115 and gate structure 112 from substrate 101. The inventors have determined that it is possible to utilize the same oxide layers in the NVM cell as those used in the FET (e.g., 200 A TEOS oxide), which minimizes the number of additional masks and thus minimizes the additional cost of providing the embedded NVM array. However, better NVM cell operating characteristics were achieved using relatively thin oxide layers in the production of NVM cell 150, and relatively thick oxide layers in the production of CMOS FET 110. In one embodiment, using a 0.18 micron CMOS process flow, oxide layers 153 and 154 comprise thermal oxide (thermal $SiO_2$) layers having a thickness in the range of 30 to 200 A (angstroms), whereas oxide layers 113 and 115 of FET 110 comprise TEOS oxide having a thickness of approximately 200 A. As mentioned above, the use of relatively thin lower oxide layers 153 (e.g., approximately 60 A) produced the desired source/drain alignment characteristics (i.e., inside edges (junctions) that align with inside edges 155S of charge storage structures 155-1). The inventors found that this lower oxide layer thickness, in combination with gate oxide (GOX) 151 having a thickness of 70 A and sidewall oxide 154 having a thickness of 80 A produced better operating results than NVM cells produced using the same GOX and TEOS oxide thicknesses utilized in the formation of "normal" transistors (e.g., TEOS oxide layers 113 and 115 approximately 200 A, and gate oxide 111 having a thickness of 70 A).

According to another aspect of the present invention, IC cell 100 includes program/erase circuitry (not shown) that facilitates the generation of suitable voltages on gate structure 152 and source/drain regions 157 in order to selectively program/erase charge storage structures 155-1 and 155-2, thereby facilitating two-bit cell operation. Two-bit operation describes the ability of NVM cell 150 to store two bits by selectively programming zero, one, or both charge storage regions 155. For example, two zero bits (a binary "00" value) may be stored by erasing both charge storage regions 155, a binary "01" value may be stored by programming only charge storage structure 155-2 (i.e., charge storage structure 155-1 remains erased), a binary "10" may be stored by programming only charge storage structure 155-1 (i.e., charge storage structure 155-2 remains erased), and a binary "11" may be stored by programming both charge storage structures 155-1 and 155-2. Circuitry for both generating program/erase voltages is known in the art, and will therefore not be discussed in detail herein. In one embodiment, no additional charge pumps are needed because the gate voltage Vg may be lower than in standard NROM cells due to programming with secondary electrons that are trapped in the middle of the channel (which is not utilized in standard NROM since does not allow two bit operation). In one embodiment, these generating program/erase voltages, as well as the signals utilized to read the stored values, are distributed to NVM cell 150 using circuitry described, for example, in co-owned U.S. Pat. No. 6,765,259 entitled "NON-VOLATILE MEMORY TRANSISTOR ARRAY IMPLEMENTING "H" SHAPED SOURCE/DRAIN REGIONS AND METHOD FOR FABRICATING SAME", which is incorporated herein by reference in its entirety.

Figure 2:
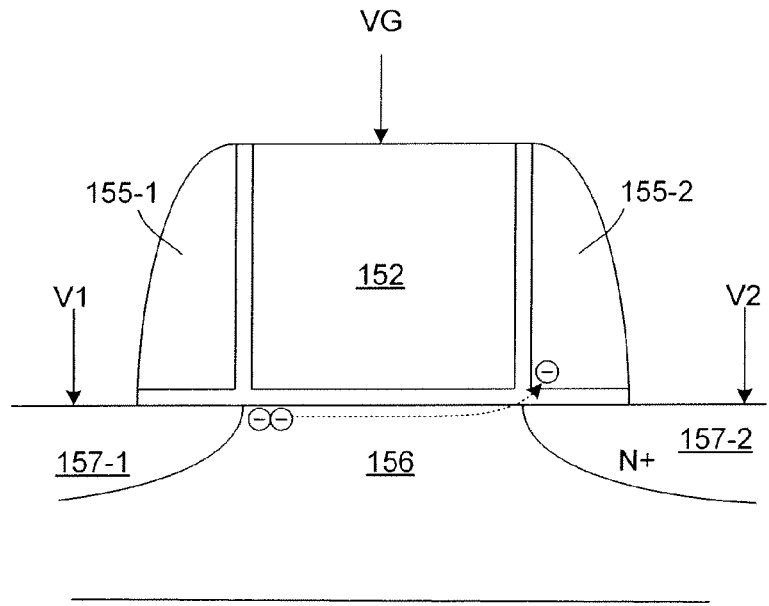
FIG. 2 is a simplified cross-sectional side view showing a non-volatile memory (NVM) cell of the integrated circuit of FIG. 1.
Figure 3A:
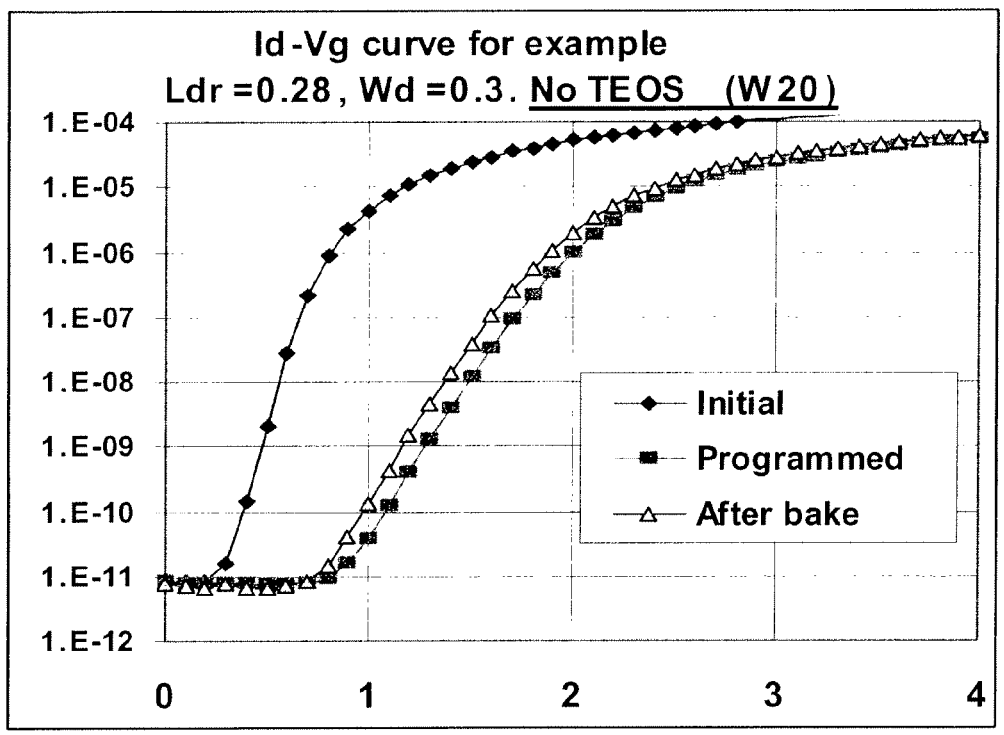
FIGS. 3(A) and 3(B) are graphs depicting experimentally obtained operating characteristics associated with NVM cells.
Figure 3B:
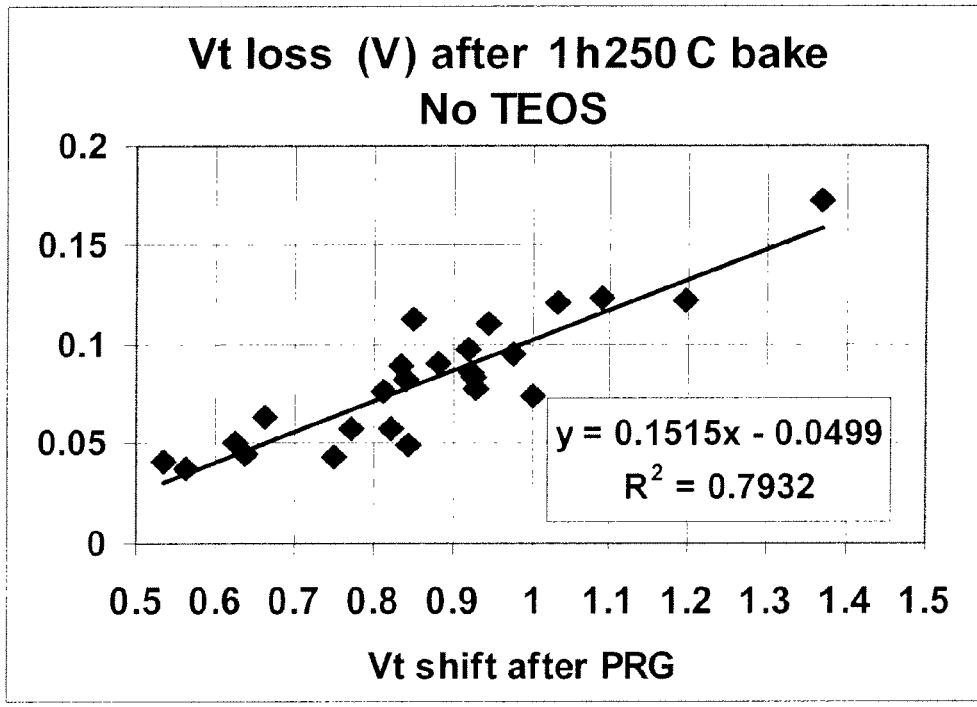

Operation of NVM cell 150 will now be described with reference to FIG. 2. In one embodiment, charge storage regions 155 are produced using SiN and thin oxide layers in the manner described above. Charge storage structure 155-2 is programmed by applying a gate voltage VG of 5 Volts, a drain voltage V2 of 5 Volts (source voltage V1 is 0 (zero) Volts, thus generating channel hot electrons (CHEs) to travel from source region 157-1 through channel 156 and enter charge storage region 155-2 (as depicted by the circled "–" symbols, representing electrons, and dashed-line arrow in FIG. 2). In one experiment, the programming time was approximately 20 ms in case of drawn channel length Ld=0.22 um, and approximately 70 ms in case of Ld=0.28 um (using a series of 5 ms pulses). Charge storage structure 155-2 was subsequently erased by applying a gate voltage VG of –5 Volts, and a drain voltage V2 of –5 Volts (source voltage V1 is 0 Volts or floating), thus inducing band-to-band tunneling (BBT) holes to enter charge storage structure 155-2. The erase time was of the order of 0.5 sec. Programming/erasing of charge storage structure 155-1 is performed in a similar manner (i.e., by reversing the source/drain voltages). Two hundred program/erase cycles were performed without appreciable change in operating characteristics. Reverse read (opposite to the direction of programming) cell characteristics in the initial and programmed states were found to be very similar to those of conventional NVM cells. As used herein, "reverse read" means, for example, when reading the individual bit value stored by charge storage structure 155-2, a suitable gate voltage VG is applied to gate structure 152, and a higher voltage is applied to source/drain region 157-1 than to source/drain region 157-2. When biased in this manner and when a sufficient charge is stored in charge storage structure 155-2, the given gate voltage VG produces a relatively low drain current that indicates the programmed state. Conversely, when charge storage structure 155-2 is erased, the reverse read produces a relatively high drain current. Experimental results of programming are show in FIG. 3(A), while the retention data of cells programmed to different Vt is presented in FIG. 3(B). Note that the retention characteristics shown in FIG. 3(B) are similar to conventional embedded NVM cells.

In addition to forming charge storage structures 155 using SiN, suitable sidewall spacer/charge storage structures may also be produced using silicon dioxide with Si nanocrystals (sometimes referred to as "local storage node memories"; this includes nitride memories as a particular case). When the sidewall spacers/charge storage structures are formed using Si nanocrystal containing oxide, programming is achieved by CHE, and erasing is performed using Fowler-Nordheim (FN) tunneling.

Figure 4:
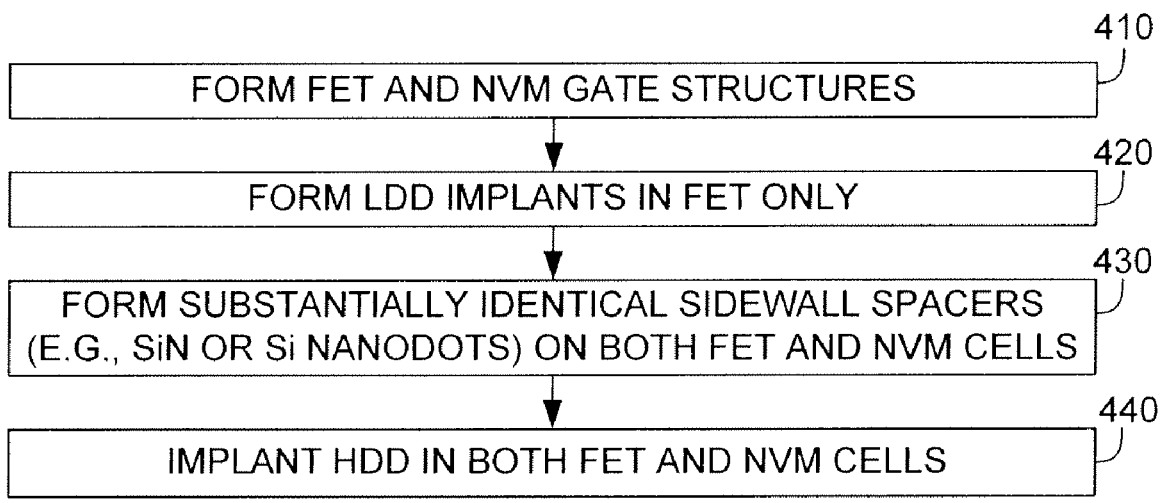
FIG. 4 is a flow diagram showing a simplified method for fabricating integrated circuits including embedded NVM arrays according to another embodiment of the present invention.

FIG. 4 is a flow diagram depicting a simplified method for producing IC 100 (described above) according to another embodiment of the present invention. The method of FIG. 4 is understood to be incorporated into a CMOS process flow, and is understood to only represent those parts of the CMOS process flow that involve the formation of NVM cell 150. Similar to a conventional CMOS process flow, the method begins by forming gate structures for both the NVM and FET transistors (block 410). The present invention differs from a convention CMOS process flow in that the LDD implant is omitted in the formation of NVM cells (i.e., LDD implants are formed only in the FETs; block 420). According to an aspect of the invention, subsequent to forming the gate structures and LDD implants, substantially identical sidewall spacer structures are formed on both the NVM and FET gate structures (block 430). In one embodiment, sidewall spacer formation involves depositing a TEOS liner (e.g., approximately 200 A), then depositing SiN (e.g., approximately 800 A) and etching back using known techniques (i.e., using the SiN TEOS liner as an etch stop). The inventors made several splits with the SiN thickness varying from 600 to 1000 A and no TEOS liner. In the NVM cells, the SiN spacer etchback stops on the "sidewall" thermal oxide. The SiN is deposited in low pressure thermal CVD system from diclorsilane ($SiH_2Cl_2$) and ammonia at 770° C. using a gas ratio of 1/10. After spacer formation, HDD implants are formed in both the NVM and FET structures (block 440), and subsequent layers are formed according to known CMOS techniques. Thus, the present method produces two types of transistors that include substantially identical sidewall spacer structures: those without LDD implants that are optimized for NVM cells, and those with LDD implants that are optimized for normal FET operations. Note that, by forming both the volatile FETs and embedded NVM array using substantially identical sidewall spacer structures (e.g., SiN), the present method avoids the need for performing a difficult double spacer etch procedure, which is required when two sidewall spacer materials are utilized. Further, by forming the entire spacer structure using a charge storing material (e.g., SiN), the resulting NVM cell is substantially more reliable than conventional cells in which the charge storing material makes up only a portion of the spacer structure. That is, when the charge storing material makes up only a portion of the spacer structure, the junction edge must be very precisely aligned under the charge storing material to prevent process related variations that inevitably lead to strong Vt (threshold voltage) and programmability spread.

As discussed above, the NVM cells of the present invention exhibit superior operating characteristics when the oxide layers located on the sides and bottom of the charge storing sidewall spacer structures are thinner than corresponding oxide layers formed on the FETs. The following embodiments illustrate methods for forming the FETs and NVM cells in a way that provides the thinner oxide layers with a minimum interruption to the CMOS process flow.

Figure 5:
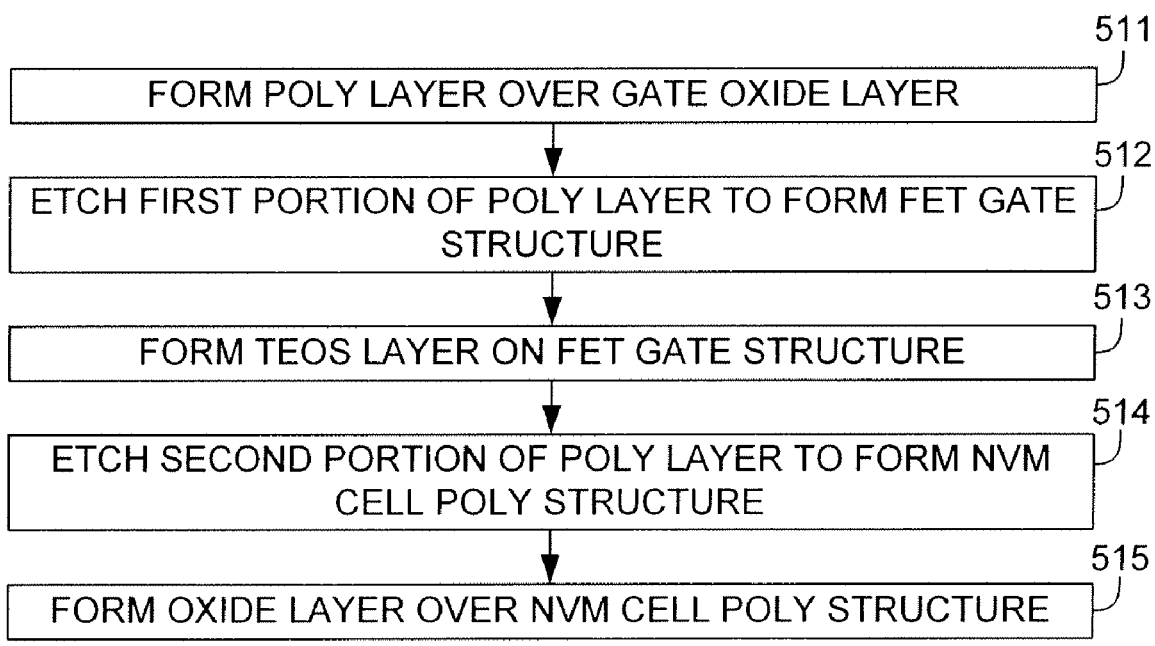
FIG. 5 is a flow diagram showing a method for fabricating NVM and FET gate structures according to a specific embodiment of the present invention.

FIG. 5 is a flow diagram depicting the formation of NVM cells with relatively thin oxide layers according to a first exemplary embodiment. After forming a polysilicon layer over a suitable gate oxide layer (block 511), a mask is patterned such that the FET gate structures are formed during the subsequent etch, but the mask prevents etching in the region of the polysilicon layer associated with the NVM gate structures (block 512). That is, a first region of the polysilicon layer is etched to form the FET gate structures, and the remaining (second) portion of the polysilicon layer (i.e., the region of polysilicon associated with the to-be-formed NVM array) is protected from etching by a blanket portion of the etch mask. LLD regions (block 420; FIG. 4) are formed at this point in the process flow. Next, the etch mask is removed, and a Tetraethyl Orthosilicate ($Si(OC_2H_5)_4$; "TEOS") oxide layer is deposited over the FET gate structures and over the remaining polysilicon layer portion using well known techniques (block 513). A second (additional) etch mask is then formed that protects the existing NVM gate structures and TEOS oxide, and facilitates etching of the remaining polysilicon layer portion to form the NVM gate structures (block 514). The second etch mask is then removed, and then a high quality oxide layer is grown on the NVM gate structures and adjacent substrate (block 515). The process flow then continues with sidewall spacer formation (block 430; FIG. 4).

Figure 6:
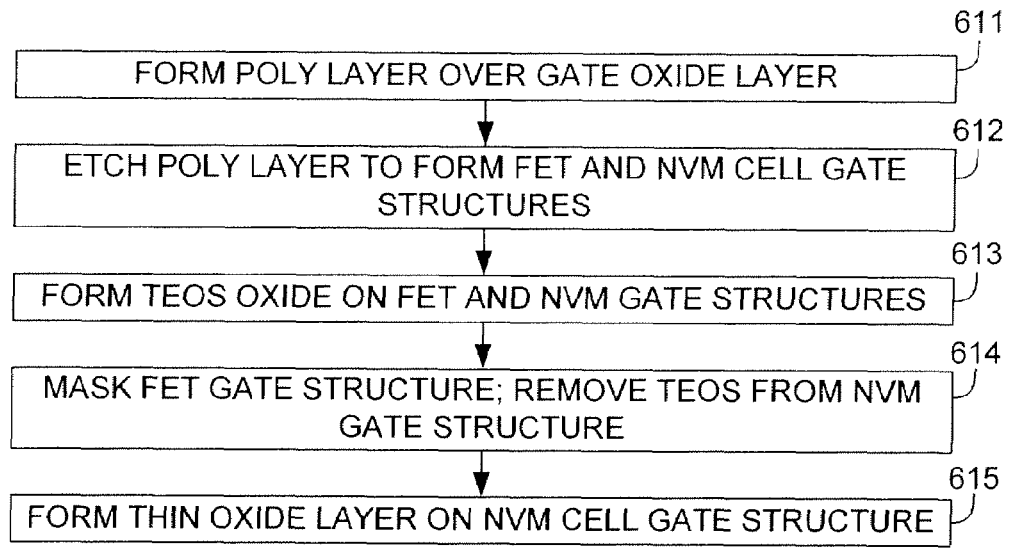
FIG. 6 is a flow diagram showing a method for fabricating NVM and FET gate structures according to another specific embodiment of the present invention.

FIG. 6 is a flow diagram depicting the formation of NVM cells with relatively thin oxide layers according to another exemplary embodiment. After forming a polysilicon layer over a suitable gate oxide layer (block 611), a mask is used to form both the FET gate structures and the NVM gate structure (block 612). LLD regions (block 420; FIG. 4) are formed at this point in the process flow. Next, a TEOS oxide layer is deposited over both the FET gate structures and the NVM gate structures (block 613). A second (additional) etch mask is then formed that protects the existing CMOS FET gate structures and associated TEOS oxide, and facilitates etching (removing) the TEOS oxide from the NVM gate structures (block 614). A high quality oxide layer is grown on the NVM gate structures and adjacent substrate (block 615). The process flow then continues with sidewall spacer formation (block 430; FIG. 4).

In accordance with another alternative embodiment, CVD oxide is used to form the bottom oxide (BOX) after TEOS removal from the NVM gate structures. In this case, the initial TEOS thickness is lower. This allows a reduction of the thermal budget of the core flow. In the standard process, there is no oxidation step after TEOS layer. In the previous embodiment CMOS experiences the "high quality oxide" thermal oxidation performed in the memory array part. This is done when LDD implants were already done. Additional thermal budget leads to their additional drive-in and can shift transistor parameters. Thus we are forced to use a low temperature oxidation for "the high quality" oxide. Another option is to deposit a thinner TEOS (150 A) and then 50 A HTO layer (at 750-800C). In this case the thermal budget can be reduced.

Figure 7:
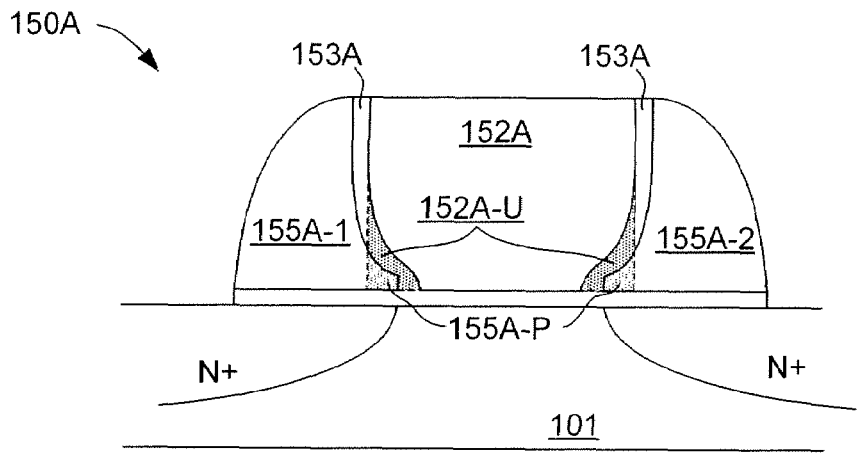
FIG. 7 is a simplified cross-sectional side view showing an NVM cell according to another embodiment of the present invention.

In accordance with another alternative embodiment, as illustrated in FIG. 7, NVM cell 150A is processed such that gate structure 152A is subjected to a wet overetch to define undercut regions 152A-U (indicted by shading and dashed lines), and charge storage structures 155A-1 and 155A-2 are formed to include protrusions 155A-P that extend into the defined undercut regions (with sidewall oxide layers 153A formed therebetween). The advantage of this modification is that protrusions are now under the gate of the memory cell and can be programmed/erased more easily because of higher vertical fields for the same voltage Vg (smaller program/erase times).

Figure 8:
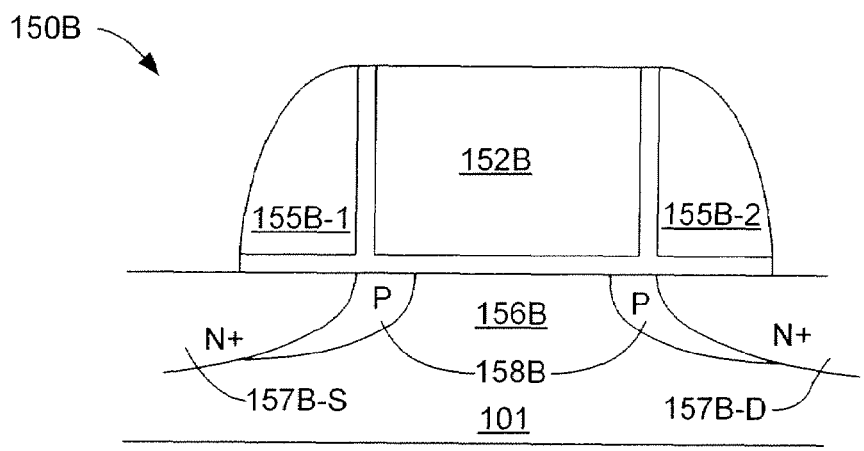
FIG. 8 is a simplified cross-sectional side view showing an NVM cell according to another embodiment of the present invention.

In accordance with yet another alternative embodiment, as illustrated in FIG. 8, NVM cell 150B is processed such that P-type pocket implants 158B are respectively formed under gate structure 152B prior to forming N+ source/drain regions 157B-S and 157B-D. The advantage of this modification is that lateral electric fields in the source/drain regions are enhanced, thus facilitating programming.

In accordance with yet another alternative embodiment, no TEOS oxide is placed under the nitride spacer of the CMOS part while it is made 200 A wider (LDD implants remain in the CMOS part). This provides a CMOS process with new spacers, and represents a change in conventional core CMOS flows in that, instead of using 200 A TEOS and 800 A Nitride, a 1000 A Nitride layer is deposited. The shape of spacer is the same. If this approach proves feasible, then this approach will eliminate the need for additional masks (e.g., by simply skipping of LDD implants in memory transistors or using P-Ldd implants as described above).

Figure 9:
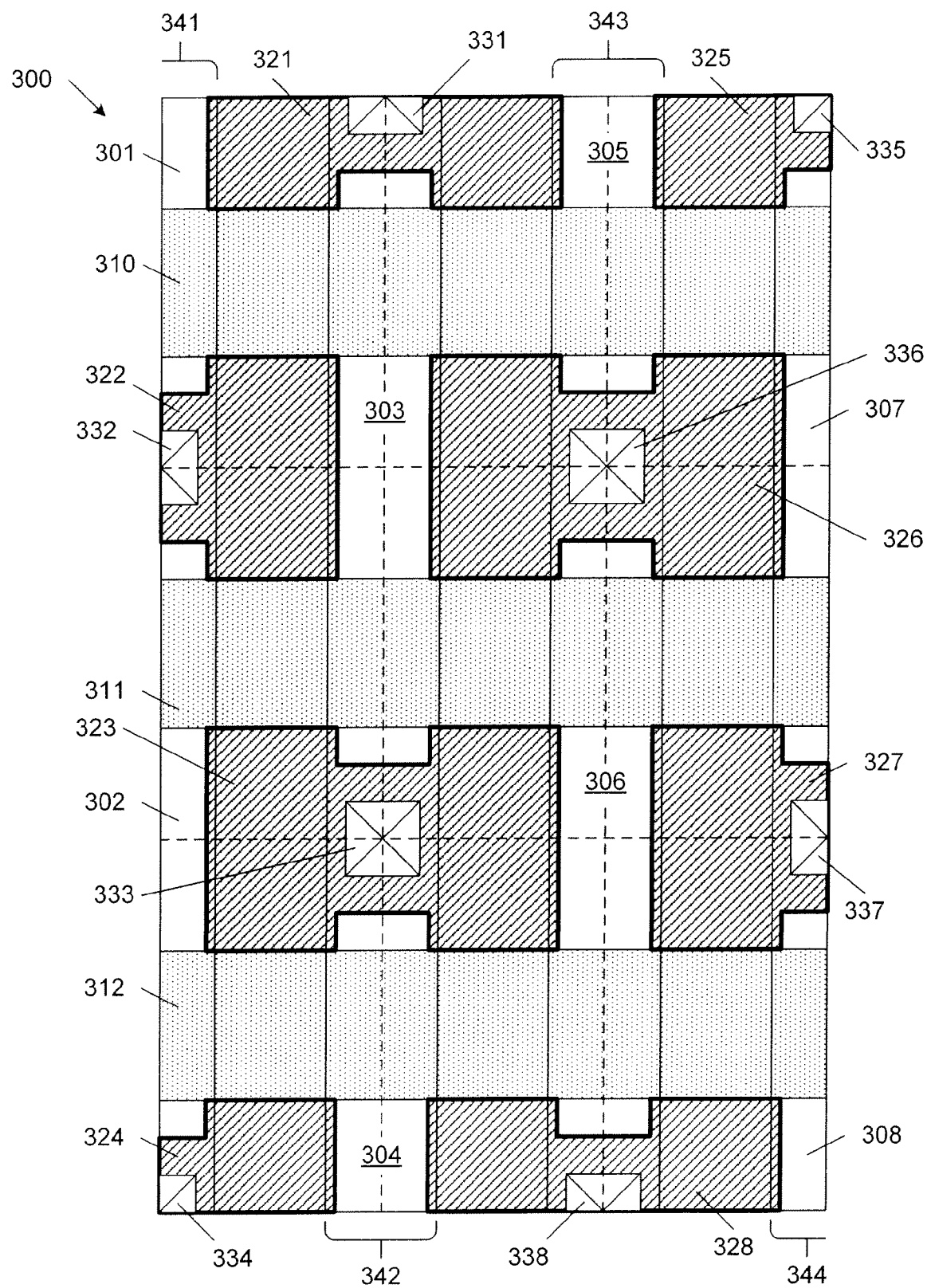
FIG. 9 is a layout diagram of a portion of an embedded NVM array that implements "H"-shaped source/drain regions in accordance with another embodiment of the present invention.
Figure 10:
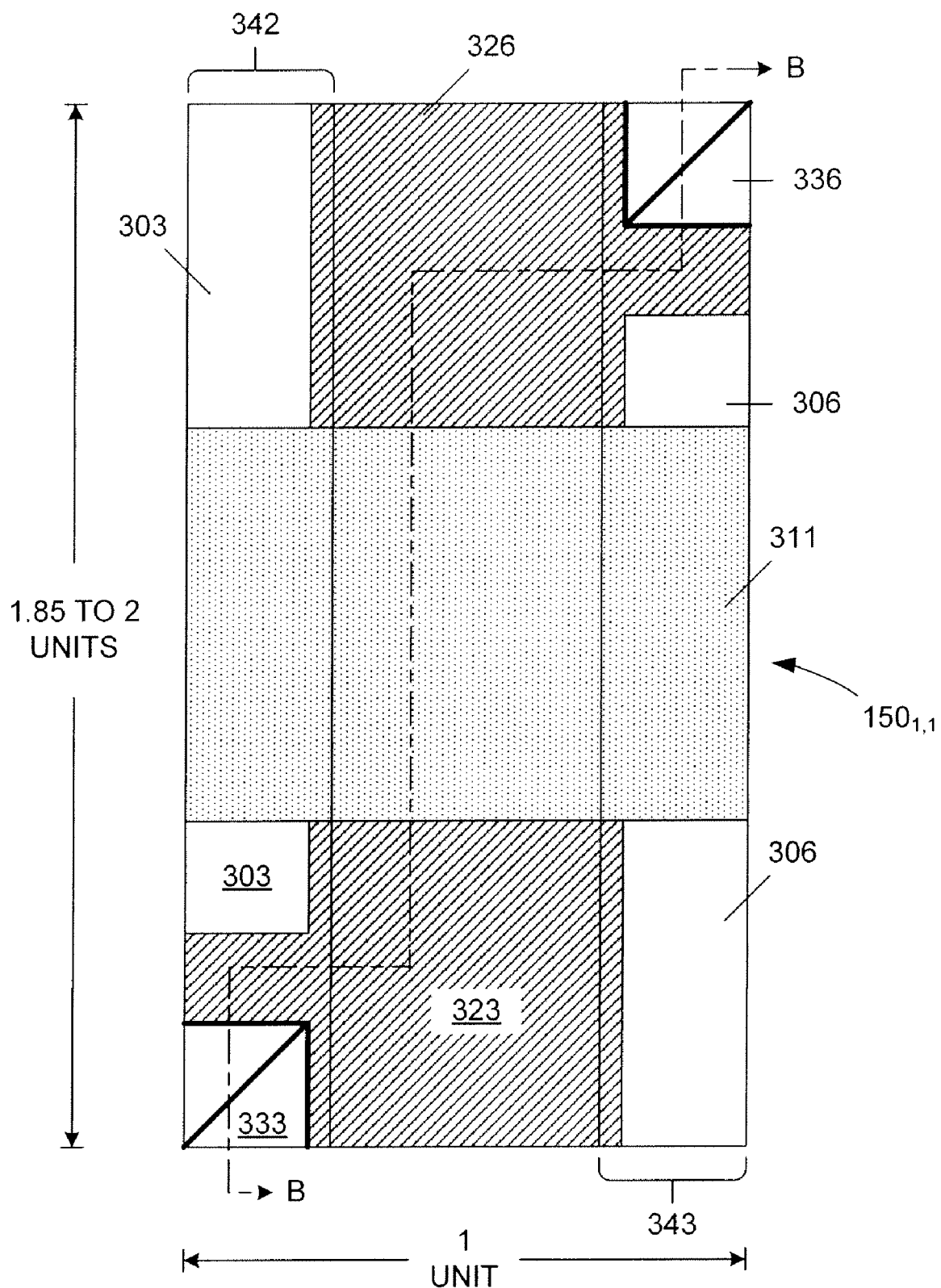
FIG. 10 is a more detailed view of the layout of FIG. 9.
Figure 11:
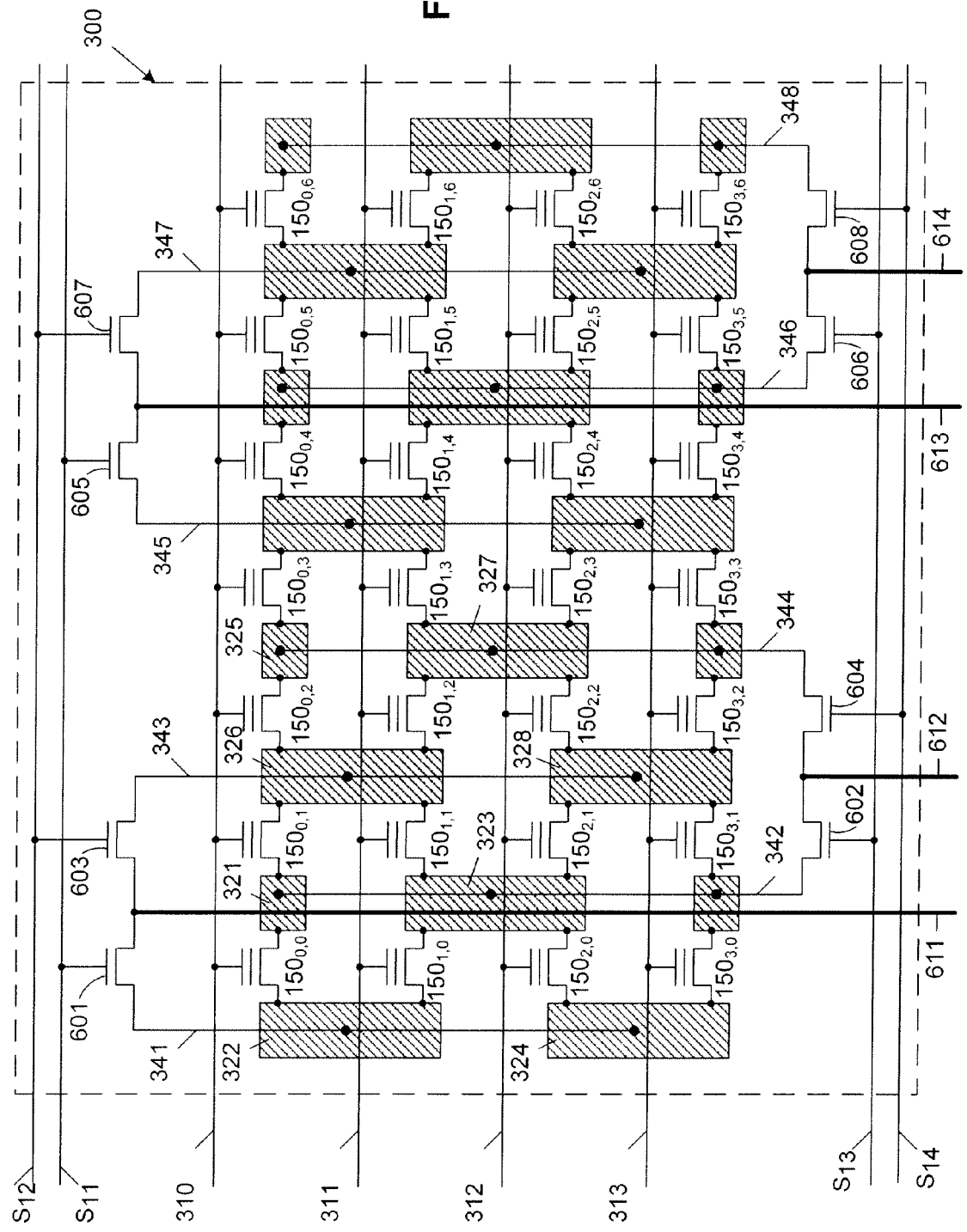
FIG. 11 is a circuit diagram of the embedded NVM array of FIG. 9 in a larger context.

FIGS. 9-11 depict an embedded array 300 including NVM cells 150 (described above). FIG. 9 is a layout diagram of a portion of embedded NVM array 300 that implements "H"-shaped source/drain regions in accordance with another embodiment of the present invention. The illustrated portion of array 300 includes field isolation regions 301-308, control gate/word lines 310-312, source/drain regions 321-328, bit line contacts 331-338, and bit lines 341-344. The NVM cell boundaries are defined by dashed lines in FIG. 9. Each of the NVM cells also includes a channel region and a floating gate region, which are not explicitly shown in FIG. 9. FIG. 10 is a more detailed view of the layout of NVM cell $150_{1,1}$ in accordance with an embodiment of the present invention. This example assumes that embedded NVM array 300 is fabricated largely in accordance with a conventional 0.18 micron CMOS process flow essentially as described above, with additional details provided in co-owned U.S. Pat. No. 6,765,259, cited above. In the described example, NVM cell $150_{1,1}$ exhibits a length-to-width ratio of about (1.85 to 2):1, and a layout area on the order of approximately 0.3 microns$^2$. Because NVM cell $150_{1,1}$ is capable of storing 2-bits of data, the layout density of NVM cell $150_{1,1}$ in this example is about 0.15 microns$^2$/bit. However, if NVM cell $150_{1,1}$ is fabricated using CMOS processes having smaller minimum line widths, the length-to-width ratio may be changed, and the layout area will be reduced. FIG. 11 is a circuit diagram of a larger portion of embedded NVM array 300. Embedded NVM array 300 implements NVM cells $150_{X,Y}$, where X and Y represent the row and column locations, respectively, of the NVM cells within array 300. Thus, NVM cell array 300 includes NVM cells $150_{0,0}$-$150_{3,6}$ (with the layout of NVM cells $150_{0,0}$-$150_{2,2}$ being described above). The rows extend along a first axis, and the columns extend along a second axis, perpendicular to the first axis. Operation of embedded NVM array 300 is described in co-owned U.S. Pat. No. 6,765,259, cited above.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for fabricating an integrated circuit including at least one field-effect transistor and at least one non-volatile memory (NVM) cell, the method comprising:
    forming first and second gate structures on a substrate, the first and second gate structures being spaced apart and each of the first and second gate structures defining side walls;
    masking the second gate structure, and forming lightly-doped source and drain regions in the substrate such that the lightly-doped source and drain regions extend under the first gate structure;
    forming first sidewall spacers adjacent the side walls of the first gate structure and second sidewall spacers adjacent the side walls of the second gate structure such that a first thickness of a first oxide layer separating the first sidewall spacers and the first gate structure are greater than a second thicknesses of a second oxide layer separating the second sidewall spacers and the second gate structure, wherein the first and second sidewall spacers comprise substantially identical structures; and
    forming heavily-doped source and drain regions in the substrate on opposite sides of the first and second gate structures such that each of the heavily-doped source and drain regions respectively extend under the first and second sidewall spacers.
    wherein forming the first and second gate structures comprises:
    forming a polycrystalline silicon layer on a gate oxide layer;
    etching the polycrystalline silicon layer to form the first gate structure;
    forming said first oxide layer on first gate structure;
    etching the polycrystalline silicon layer to form the second gate structure; and
    forming said second oxide layer on second gate structure,
    wherein forming the first oxide layer comprises forming TEOS oxide layers having thicknesses of approximately 200 angstroms on both the sidewalls of the first gate structure and on first exposed surface portions of the substrate located adjacent to the first gate structure, and
    wherein forming the second oxide layer comprises forming an oxide layer having a thickness in the range of 30 to 200 A on second exposed portions of the substrate located adjacent to the second gate structure.

2. The method of claim 1,
    wherein forming the second gate structure comprises utilizing a wet etch such that the second gate structure defines an undercut region located adjacent to an upper surface of the substrate, and
    wherein forming the second sidewall spacers comprises forming a protrusion extending into the defined undercut regions.

3. The method of claim 1, further comprising forming pocket implants under the second gate structure before forming the heavily-doped source and drain regions.

4. A method for fabricating an integrated circuit including at least one field-effect transistor and at least one non-volatile memory (NVM) cell, the method comprising:
    forming first and second gate structures on a substrate, the first and second gate structures being spaced apart and each of the first and second gate structures defining side walls;
    masking the second gate structure, and forming lightly-doped source and drain regions in the substrate such that the lightly-doped source and drain regions extend under the first gate structure;
    forming first sidewall spacers adjacent the side walls of the first gate structure and second sidewall spacers adjacent the side walls of the second gate structure such that a first thickness of a first oxide layer separating the first sidewall spacers and the first gate structure are greater than a second thicknesses of a second oxide layer separating the second sidewall spacers and the second gate structure, wherein the first and second sidewall spacers comprise substantially identical structures; and
    forming heavily-doped source and drain regions in the substrate on opposite sides of the first and second gate structures such that each of the heavily-doped source and drain regions respectively extend under the first and second sidewall spacers,
    wherein forming the first and second gate structures comprises:
    forming a polycrystalline silicon layer on a gate oxide layer;
    etching the polycrystalline silicon layer to form the first gate structure and the second gate structure;
    forming said first oxide layer on the first gate structure and the second gate structure;
    masking the first gate structure, and etching the first oxide layer from the second gate structure; and
    forming said second oxide layer on second gate structure,
    wherein forming the first oxide layer comprises forming TEOS oxide layers having thicknesses of approximately 200 angstroms on both the sidewalls of the first gate structure and on first exposed surface portions of the substrate located adjacent to the first gate structure, and
    wherein forming the second oxide layer comprises forming an oxide layer having a thickness in the range of 30 to 200 A on second exposed portions of the substrate located adjacent to the second gate structure.

5. The method of claim 4,
    wherein forming the second gate structure comprises utilizing a wet etch such that the second gate structure defines an undercut region located adjacent to an upper surface of the substrate, and wherein forming the second sidewall spacers comprises forming a protrusion extending into the defined undercut regions.

6. The method of claim 4, further comprising forming pocket implants under the second gate structure before forming the heavily-doped source and drain regions.

* * * * *